United States Patent [19]
Aoki

[11] Patent Number: 5,329,148
[45] Date of Patent: Jul. 12, 1994

[54] SEMICONDUCTOR DEVICE AND PREPARING METHOD THEREFOR

[75] Inventor: Hitoshi Aoki, Nara, Japan

[73] Assignee: Sharp Kabushiki Kaisha, Osaka, Japan

[21] Appl. No.: 785,073

[22] Filed: Oct. 30, 1991

[30] Foreign Application Priority Data

Nov. 20, 1990 [JP] Japan .................................. 2-316608

[51] Int. Cl.⁵ .................... H01L 27/10; H01L 29/06; G11C 17/00
[52] U.S. Cl. .................................. 257/390; 257/387; 257/622; 365/104
[58] Field of Search .................... 357/23.4, 55, 20, 45; 257/390, 387, 622; 365/104

[56] References Cited

U.S. PATENT DOCUMENTS

| | | |
|---|---|---|
| 4,380,866 | 4/1983 | Countryman, Jr. et al. |
| 4,839,704 | 6/1989 | Mohammadi et al. ................. 357/20 |
| 4,964,080 | 10/1990 | Tzeng ................................. 365/185 |
| 5,214,303 | 5/1993 | Aoki ................................... 257/387 |

FOREIGN PATENT DOCUMENTS 63-90853  4/1988  Japan .......................... H01L 29/78

Primary Examiner—Mark V. Prenty
Attorney, Agent, or Firm—Nixon & Vanderhye

[57] ABSTRACT

A semiconductor device which comprises a semiconductive substrate having thereon a plurality of source/drain regions arranged parallel to each other and a plurality of gate electrodes which extend perpendicularly to and above the source/drain regions through a gate oxide film, wherein at least one of a specific pair of source and drain regions corresponding to any desired at least one of the gate electrodes is provided with an offsetting stepped portion extending in the direction of depth of the substrate, and the offsetting stepped portion is filled up with an insulating film for filling up the stepped portion, so that the specific source/drain region provided with the offsetting stepped portion is disposed with respect to the corresponding gate electrode through a step of the offsetting stepped portion.

11 Claims, 6 Drawing Sheets

SEMICONDUCTOR DEVICE AND PREPARING METHOD THEREFOR

BACKGROUND OF THE INVENTION

1. Field of the Invention

The invention relates to a semiconductor device and a preparing method therefor and more particularly to a NOR-type mask ROM (Read Only Memory) provided with a memory cell function memorizing 2 bit information and a preparing method for the NOR-type mask ROM.

2. Description of the Related Art

A conventional NOR-type mask ROM (provided by previously forming source/drain regions followed by formation of gate electrodes) is exemplified in FIGS. 6 (a), 6 (b) and 6 (c). The sectional views of FIGS. 6(b) and 6(c) are taken from the lines A—A' and B—B', respectively of the plan view of FIG. 6(a).

Inside the top surface of a semiconductive substrate 51 of a first conductivity type are disposed a plurality of parallel, strip-like shaped source/drain regions 52 of a second conductivity type. A plurality of strip-like shaped gate electrodes 54 are formed above the source/drain regions 52 to extend perpendicularly thereto and be spaced with each other at a fixed interval, having a gate oxide film 53 between the gate electrodes 54 and the source/drain regions 52. Information is written in such manner that any impurity ion is selectively implanted in a channel region of memory cell transistors to form thereat a high doped region 55 of an impurity of the first conductivity type, so that threshold voltage is changed. The memory cell merely allows each transistor to memorize information only of 1 bit.

A memory cell for a mask ROM memorizing 2 bit information may be achieved, as shown in FIG. 5, by that a source/drain region and a gate electrode in MOS transistors have offset with each other, thereby allowing the transistors to have orientation in conductivity properties.

As shown in FIG. 5(a), on the surface of a semiconductive substrate 61 of a first conductivity type are formed impurity regions 62a (62c) and 62b (62d) of a second conductivity type constituting source/drain regions. A gate electrode 64 is disposed on the substrate between the specific two source/drain regions through a gate oxide film 63. The gate electrode 64 is adapted to overlap with one source/drain region 62a and be spaced at a predetermined interval "1" away from the other source/drain region 62b.

When using, as shown in FIG. 5(b), the region 62a as source and that 62b as the drain in the transistor constructed above, the offset region F provided between the gate electrode 64 and the drain region 62b is applied with high electric field to have a depletion layer 66, thereby causing a channel region 67 and the drain 62b to electrically communicate with each other.

In case that the region 62c is used as drain and that 62d as source as shown in FIG. 5(c), the depletion layer 66 is not formed at the offset region F, so that the source region 62d does not communicate electrically with the channel region 67.

This technique may be adopted to allow MOS transistors to have orientation in conductivity properties and be capable of exhibiting the following four states.

i) Every source and drain regions in transistors overlap with gate electrodes, thereby enabling electrical communication in both of normal and reverse directions.

ii) Only source regions overlap with gate electrodes, so that there causes electrical communication in a normal direction but not so in a reverse direction.

iii) Only drain regions overlap with gate electrodes, so that there is no electrical communication in the normal direction but is in the reverse direction.

iv) Each of source and drain regions are kept away from gate electrodes, so that there causes no electrical communication in either direction.

Accordingly, information is read out of each memory cell transistor two times in the normal and reverse directions, thereby enabling reading of 2 bit information.

The conventional NOR-type mask ROM as shown in FIG. 6(b) is so constructed that gate electrodes 54 completely overlap with the source/drain regions 52, so that the mask ROM can not be applied with a function for a memory cell transistor memorizing 2 bit information as shown in FIG. 5, thereby being hindered from developing into a larger scale device.

SUMMARY OF THE INVENTION

According to the present invention, there are provided:

a semiconductor device which comprises a semiconductive substrate having thereon a plurality of source/drain regions arranged parallel to each other and a plurality of gate electrodes which extend perpendicularly to and above the source/drain regions through a gate oxide film, wherein at least one of a specific pair of source and drain regions corresponding to at least one of the gate electrodes is provided with an offsetting stepped portion extending in the direction of depth of the substrate, and the offsetting stepped portion is filled up with an insulating film for filling up the stepped portion, so that the specific source/drain region provided with the offsetting stepped portion is disposed with respect to the corresponding gate electrode through a step of the offsetting stepped portion; and a manufacturing method for a semiconductor device which comprises a semiconductive substrate having thereon a plurality of source/drain regions arranged parallel to each other and a plurality of gate electrodes which extend perpendicularly to and above the source/drain regions through a gate oxide film, wherein at least one of a specific pair of source and drain regions corresponding to at least one of the gate electrodes is provided with an offsetting stepped portion extending in the direction of depth of the substrate, and the offsetting stepped portion is filled up with an insulating film for filling up the stepped portion, so that the specific source/drain region provided with the offsetting stepped portion is disposed with respect to the corresponding gate electrode through a step of the offsetting stepped portion, the manufacturing method involving the following steps:

(i) forming on the semiconductive substrate in order an ion implantation mask for providing the source/drain regions and a resist pattern for providing an information writing region, (ii) recessing in the depth direction of the semiconductive substrate by use of the resist pattern as a mask at least one of specific surface areas of the semiconductive substrate on which surface areas the specific pair of source and drain regions are to be provided, thereby forming the offsetting stepped portion, (iii) removing the resist pattern and applying thermal oxidation to the offsetting stepped portion to cover an inner wall thereof with an insulating film of the same material as used for a gate insulating film, (iv) implanting impurities onto the semiconductive substrate by use of the ion implantation mask to form a pair of source/drain regions, (v) removing the ion implantation mask, and then filling up the offsetting stepped portion with the insulating film therefor, (vi) implanting impurity ions onto the whole surface of the semiconductive substrate through the gate insulating film, and (vii) thereafter forming gate electrodes.

DETAILED DESCRIPTION OF THE PREFERRED EMBODIMENTS

The present invention recesses semiconductive substrate to form an offsetting stepped portion thereat, and fills up the offsetting stepped portion with an insulating film for filling up the same to prepare a NOR-type mask ROM having a function for memory cells memorizing 2 bit information. According to the present invention, an offsetting region may be provided even in a NOR-type type mask ROM (memory cell) of the conventional example as shown in FIG. 6(b) wherein gate electrode 54 is adapted to completely cover source/drain regions 52. Also, since the offsetting stepped portion for writing information is arranged vertically but not transversely of the device, memory cells are capable of being subminiaturized and a larger scale mask ROM which fully utilizes characteristics of 2 bit information memory cells can be prepared.

Preferable ion implantation methods for the present invention are those to be carried out at 0° wherein an impurity is applied to the substrate surface in the direction of normal line which extends perpendicularly thereto.

Figure 1A:
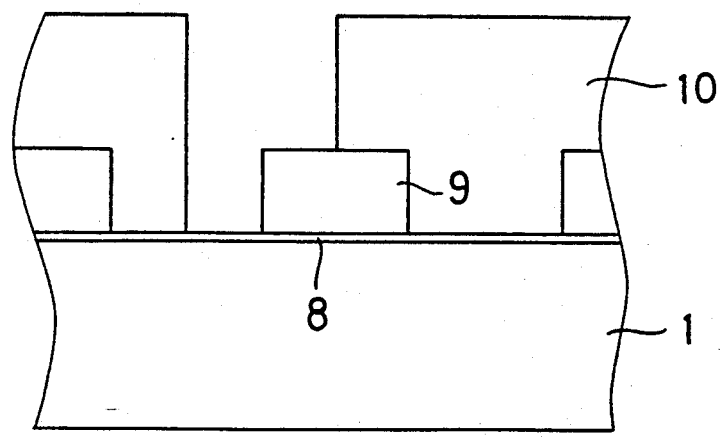
FIGS. 1 (a) to 1 (d) are schematic diagrams showing the forming process of an example of the present invention.
Figure 1B:
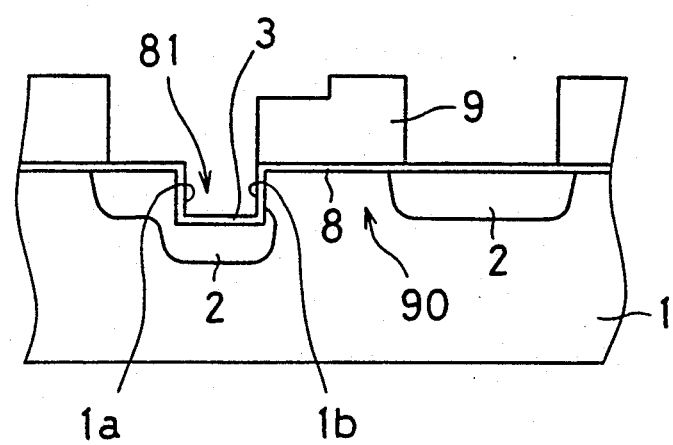
Figure 1C:
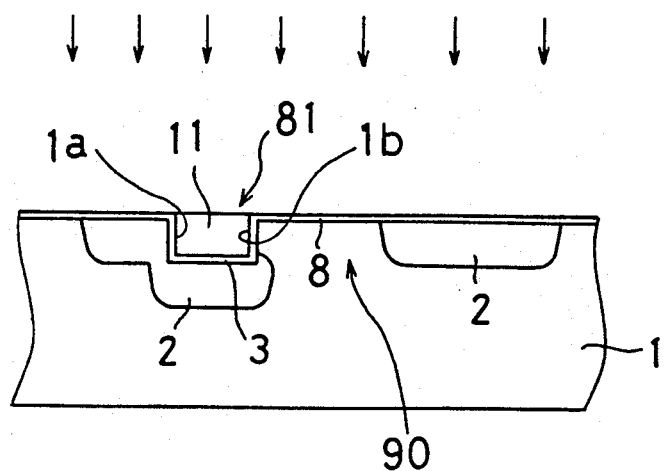
Figure 1D:
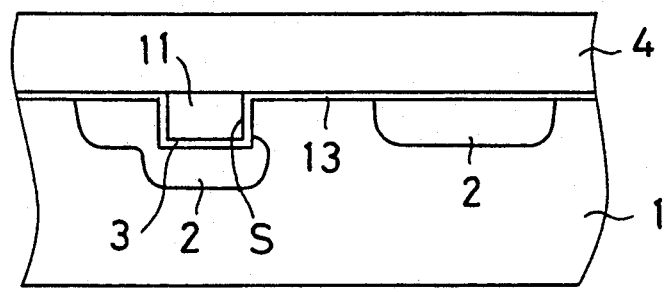

A source/drain region to be formed beside the offsetting stepped portion comprises, as shown in FIG. 1(d), a lower part located just under the offsetting stepped portion 81 and an upper part which extends from the lower part and includes a portion located by the side face of stepped portion 81 opposite to its other side where a channel region 7 is formed between a pair of source/drain regions 2, 2.

Depth of diffusion for forming the source/drain regions 2,2 is preferably 0.15 to 0.3 μm.

Height of the offsetting stepped portion 81 may be 0.1 to 0.25 μm and preferably to 0.2 μm. In this case, it is essential for the source/drain region 2 to form a side wall 1a of silicon substrate (See FIG. 1(b)).

Thickness of an insulating film 11 for filling up the stepped portion is preferably to be set to 0.15 to 0.35 μm, so that when the source/drain regions 2, 2 in the transistor are applied with voltage, a channel is prevented from being generated at a side wall 1b of the silicon substrate.

Figure 2:
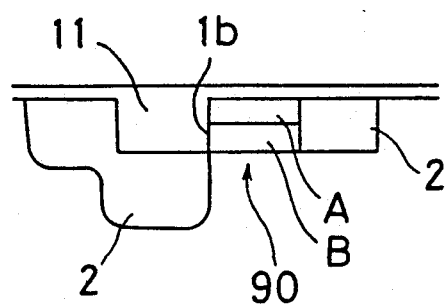
FIG. 2 is a schematic diagram showing a structure of a principal portion in the above example.

The channel region 7 to be formed between the pair of source/drain regions 2, 2 comprises an upper (a surface) part A and a lower part B (FIG. 2), density of impurity in the lower part B being higher than that in the upper part A.

Figure 4A:
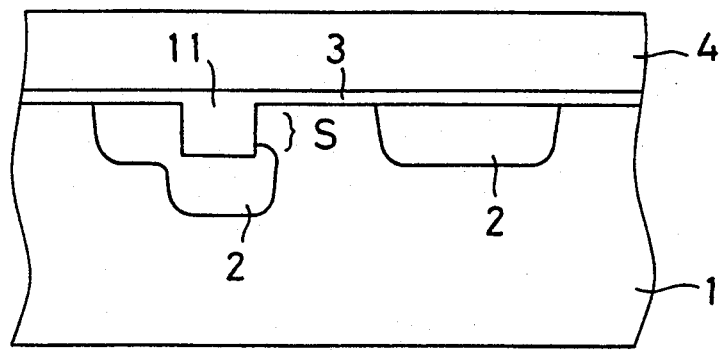
FIGS. 4(a), 4(b) and 4(c) are schematic diagram showing a function in the above example.
Figure 4B:
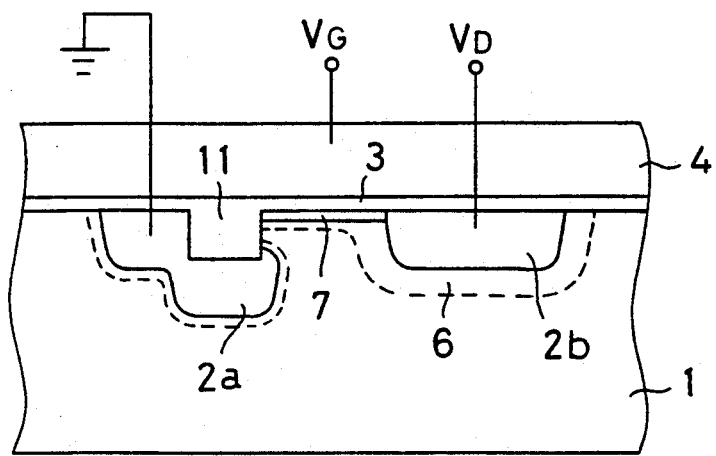

In detail, it is required to make higher density of impurity in the lower part B than the surface part A, i.e., make higher density of impurity on the surface of the side wall 1b, so that threshold voltage of the transistor generated at the side wall 1b in the state of FIG. 4(b) is made fully higher, for example, at 6V, thereby preventing occurrence of a channel.

Figure 4C:
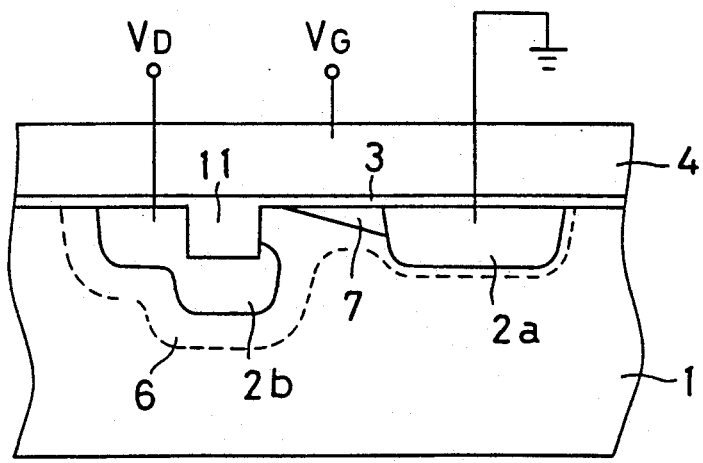

When density of impurity in the lower part B of channel region 7 is extremely high, impurity density in the surface part A changes, so that threshold value of the transistor in the state of FIG. 4(c) is made higher. Hence, the density of impurity in the lower part B of channel region 7 is required to be set to such an optimum value that difference of threshold values between the state of FIG. 4(b) and that of FIG. 4 (c) becomes largest.

Next, the manufacturing method for the semiconductor device will be detailed according to the attached drawings. The present invention should not limited to the examples.

Shown in FIG. i is an example of the present invention. $SiO_2$ film 8 and an ion implantation mask 9 for forming source/drain regions are first formed on a p-type silicon substrate 1 as shown in FIG. 1(a), and a resist pattern 10 for writing information is provided.

The $SiO_2$ film 8 and the silicon substrate 1 are then etched, for example, at 0.15 μm by use of the ion implantation mask 9 and the resist pattern 10 as a mask.

The resist pattern 10 is removed and a recess (an offsetting stepped portion) 81 is applied with thermal oxidation to additionally provide an insulating film 3 of $SiO_2$, the same material as used for $SiO_2$ film 8, covering an inner wall of the stepped portion 81. Impurity of a second conductivity type, such as As, is then implanted, for example, at $10^{15}$ cm$^{-3}$ into the substrate followed by a heating process to form the source/drain regions 2 (See FIG. 1(b)). The ion implantation is carried out at 0° to prevent the ion from entering a side wall 1b of the stepped portion of the silicon substrate (beside a channel region 90).

The ion implantation mask 9 is removed and the recess 81 is filled up in such a known technique that a recess filling-up insulating film 11 of $SiO_2$ and 0.15 μm in thickness is deposited in the recess 81, so that a top surface of deposition is flat. In the state of FIG. 1(c), an impurity is applied, for example at 70 KeV as having a peak at the same point as depth of the stepped portion, to the channel region 90 through the $SiO_2$ film according to an ion implantation process, so that the slightly lower part B of the channel region 90 shown in FIG. 2 has a higher density of impurity (about $10^{18}$ cm$^{-3}$) than the density of impurity (about $10^{17}$ cm$^{-3}$), such as Boron, of the surface part A.

Finally, gate electrodes 4 are formed over a gate oxide film 13 to obtain a memory cell transistor (See FIG. 1(d)).

The gate oxide film 13 is provided again after removal of the SiO₂ film 8.

Figure 3A:
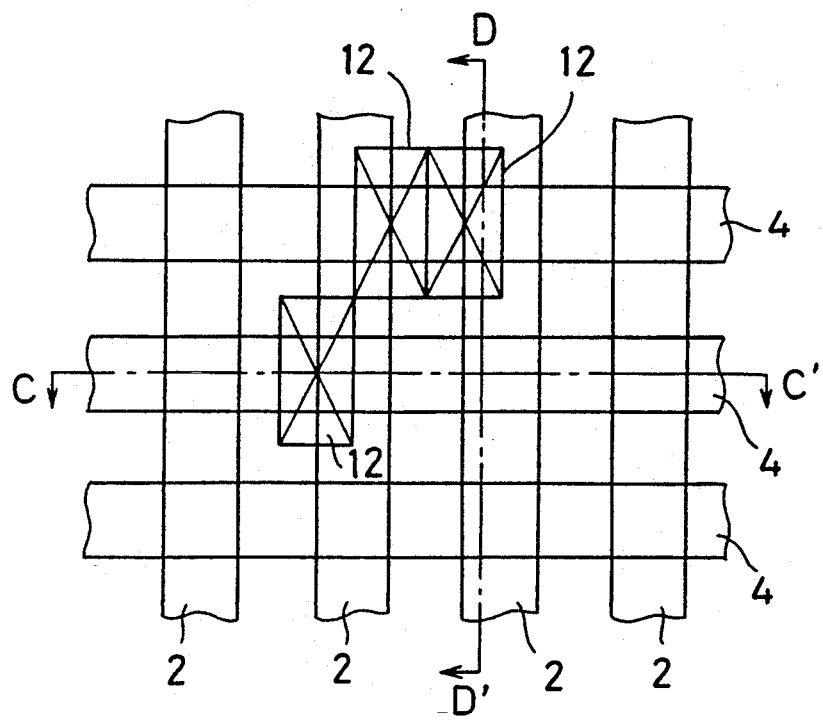
FIG. 3(a) is a schematic diagram showing a structure of a principal portion in the above example.
Figure 3B:
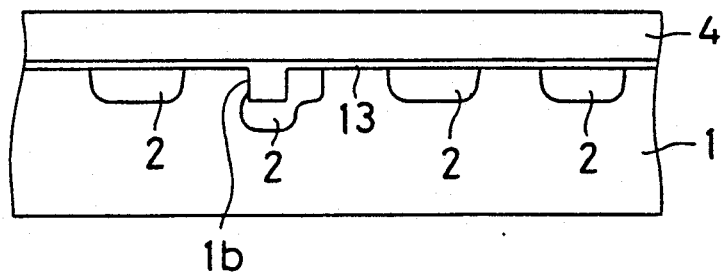
FIGS. 3(b) and 3(c) are sectional views taken from the lines C—C' and D—D', in FIG. 3(a) .
Figure 3C:
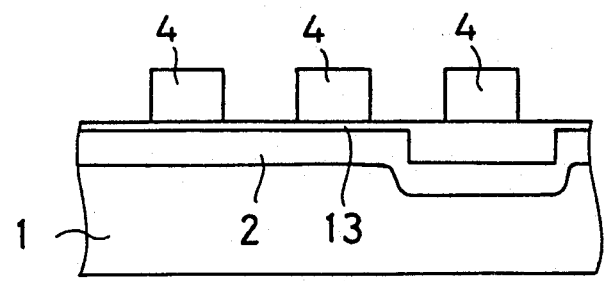

FIGS. 3 (a) to (c) exemplify a layout of a memory cell of the semiconductor device prepared by the above method. FIG. 3 (a) is a plan view and FIGS. 3 (b) and 3 (c) are sectional views taken from the lines C—C′ and D—D′ in FIG. 3(a).

As seen, the semiconductor device has on the whole surface of the silicon substrate a plurality of source/drain regions 2 arranged parallel to each other and a plurality of gate electrodes 4 which extend perpendicularly to and above the source/drain regions. At least one of a specific pair of source and drain regions corresponding to at least one of the gate electrodes is provided with an offsetting stepped portion 81 extending in the direction of depth of the substrate, and the offsetting stepped portion is filled up with an insulating film 11 for filling up the stepped portion, so that the specific source/drain region 2 provided with the offsetting stepped portion is disposed with respect to the corresponding gate electrode through a step of the offsetting stepped portion.

Figure 6A:
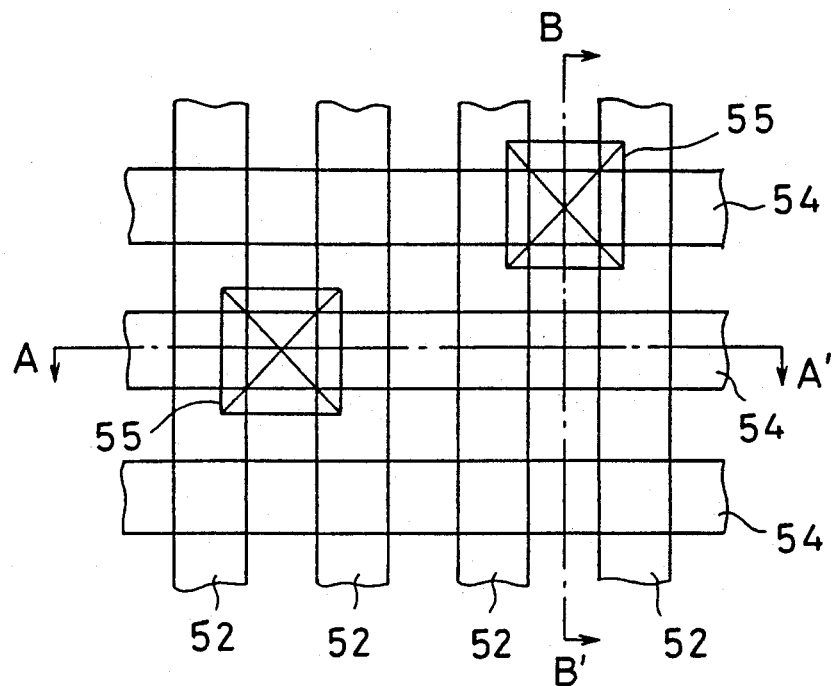
FIG. 6(a) is a schematic diagram showing a structure of a principal portion of the conventional example.
Figure 6B:
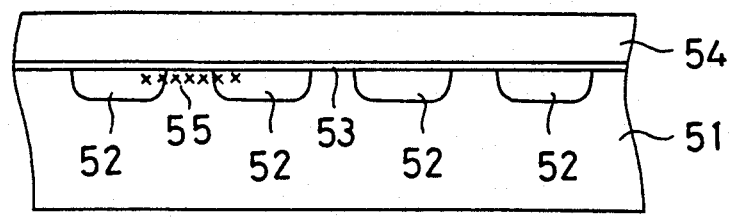
FIGS. 6(b) and 6(c) are sectional views taken from the lines A—A' and B—B' in FIG. 6(a).
Figure 6C:
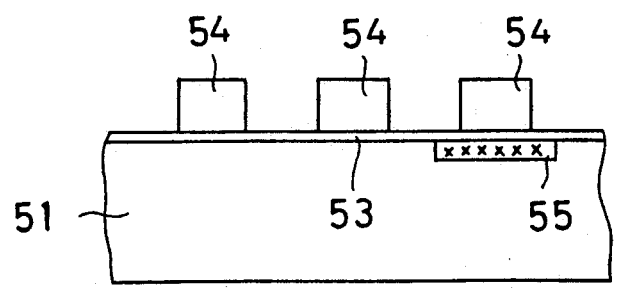

Hence, the step is provided on the silicon substrate 1 at a point where the information writing pattern 12 overlaps with the specific source/drain regions 2, so that the information writing pattern 12 is half in volume in comparison with the information writing region 55 of the conventional art shown in FIG. 6, thereby enabling information to be written twice.

Figure 5A:
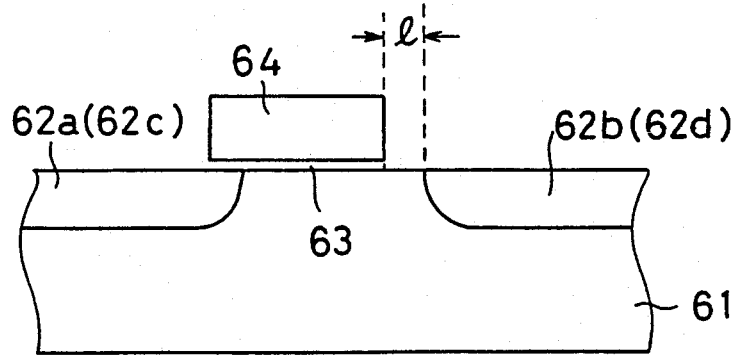
FIGS. 5(a), 5(b) and 5(c) are schematic diagrams showing separate functions of 2 bit information memorizing mask ROM memory cells.
Figure 5B:
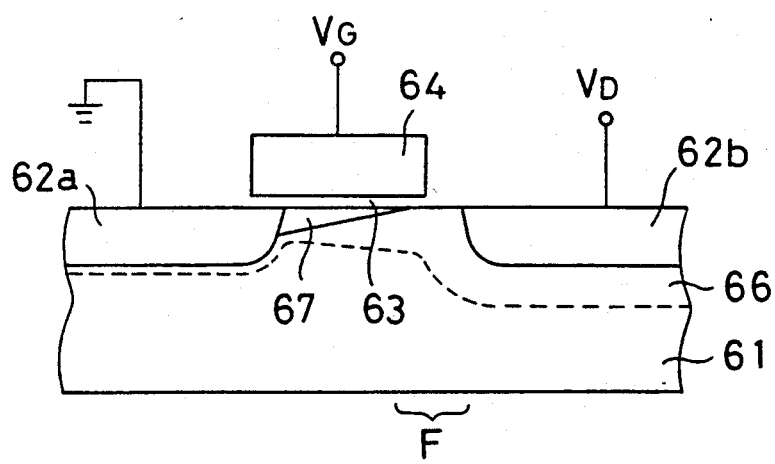
Figure 5C:
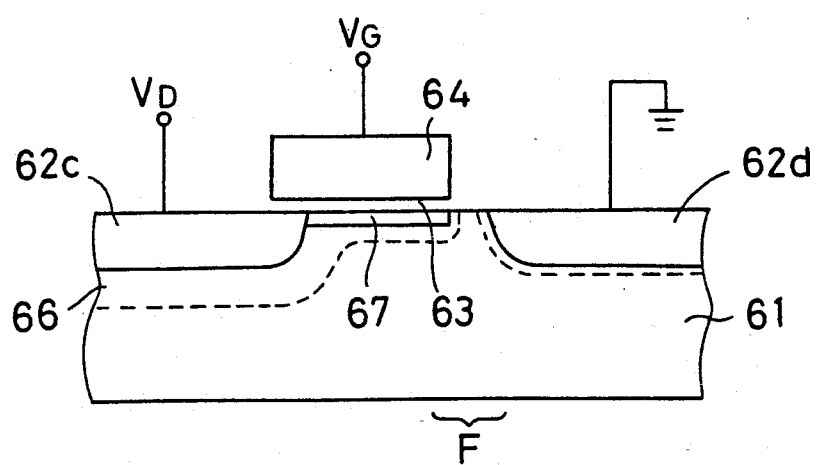

The transistors of the present invention have an identical function to that of the conventional offset transistors shown in FIG. 5 having orientation in conductivity properties. When using as source 2a the side (the region S) where the source/drain 2, 2 and the gate electrode 4 are adapted to offset with each other as shown in FIG. 4(a), the transistor has no electrical communication (See FIG. 4(b)). In case that the region S is used as drain 2b as shown in FIG. 4(c), there causes electrical communication in the transistor.

In the present example, for provision of the offsetting stepped portion 81 between the specific source/drain regions 2, 2 and the gate electrode 4, the silicon substrate is previously recessed at its portion for the source/drain regions before ion implantation for forming the same. After ion implantation and activation, the recess of the substrate is filled up with an insulating film to provide the offsetting region extending in the depth direction of the substrate. Also, the ion implantation is carried out at 0° for forming the source/drain regions. Hence, a memory cell transistor memorizing 2 bit information can be realized and developed into a larger memory scale device.

In detail, the memory cell for the NOR-type mask ROM of the present invention can be doubled in memory scale in comparison with the conventional example exemplified in FIG. 6.

The above example refers to the case that the offsetting stepped portion is provided at one of the pair of source/drain regions corresponding to a specific gate electrode in one transistor among a number of transistors formed on the silicon substrate. The respective offsetting stepped portions may be provided at either of the pairs of source/drain regions corresponding to a plurality of gate electrodes of transistors; at both of the specific pair of source/drain region corresponding to one gate electrode in a transistor; or at both of the specific pairs of source/drain regions corresponding to a plurality of gate electrodes of transistors. Also, for a number of transistors formed on a silicon substrate, the offsetting stepped portion may be formed at either of source/drain regions corresponding to gate electrodes or at both of source/drain regions corresponding to gate electrodes.

As seen from the above, according to the present invention, the function of memory cell transistors for 2 bit information memorizing mask ROM using the offset of source/drain regions can be applied to the NOR-type mask ROM by provision of the vertical offsetting in the semiconductor substrate, and thereby enabling the NOR-type mask ROM memory cells to be further subminiaturized.

What is claimed:

1. A memory cell array providing a plurality of memory cells which comprises:
   a semiconductive substrate having thereon a plurality of source/drain regions arranged parallel to each other;
   a plurality of gate electrodes which extend perpendicularly to and above the source/drain regions through a gate oxide film; and
   a channel region formed in the semiconductor substrate between source/drain regions and just below the gate electrode;
   wherein a memory cell of the array is formed at a crossing of a pair of the source/drain regions and one of the gate electrodes, either source/drain region of the memory cell having a side which is spaced from an upper surface of the substrate to form an offsetting stepped portion between the source/drain region and the channel region, and the offsetting stepped portion is filled up with an insulating film for filling up the stepped portion, so that the specific source/drain region provided with the offsetting stepped portion is disposed with respect to the corresponding gate electrode through the offsetting stepped portion and the gate electrode extends over the pair of the source/drain regions and over the offsetting stepped portion.

2. A memory cell array according to claim 1, wherein the source/drain regions to be formed beside the offsetting stepped portion comprises a lower region located just below the offsetting stepped region and an upper region which extends from the lower region and includes a part by the side of the offsetting stepped portion opposite to its side where a channel region is provided between the pair of source/drain regions.

3. A memory cell array according to claim 1, wherein depth of the offsetting stepped portion is set to be shorter than depth of diffusion of an impurity diffusion layer for forming the source/drain regions.

4. A memory cell array according to claim 1, wherein the insulating film for filling up the stepped portion is deposited in enough thickness to prevent occurrence of a channel at the offsetting stepped portion.

5. A memory cell array according to claim 1, wherein the channel region has a higher density of impurity in the lower part of the channel region than in the surface part thereof.

6. A memory cell array according to claim 1, wherein for at least one of the memory cells, both source/drain regions are provided with an offsetting stepped portion.

7. A memory cell array according to claim 5, wherein the impurity in the channel region has a same conductivity type as does the semiconductor substrate.

8. A two bit memory cell comprising:
a semiconductive substrate having an upper surface, the substrate having therein a pair of source/drain regions arranged parallel to each other;
a gate electrode which extends perpendicularly to and above the source/drain regions; and
a channel region formed in the semiconductor substrate between source/drain regions and just below the gate electrode;
wherein the memory cell is formed at a crossing of the pair of the source/drain regions and the gate electrode, at least one of the source/drain regions having a side which is spaced from the upper surface of the substrate in such a manner that electrical conduction occurs between the pair of source/drain regions when a voltage is applied to the recessed source/drain region for operating the recessed source/drain region as a drain, but wherein electrical conduction does not occur between the pair of source/drain regions when the recessed source/drain region is operated as a source; and
wherein the gate electrode extends over the pair of the source/drain regions.

9. A two-bit memory cell according to claim 8, wherein the recessed source/drain region is recessed under a trench formed in the surface of the substrate, and wherein the trench is filled with an insulating film.

10. A two bit memory cell comprising:
a semiconductive substrate having an upper surface, the substrate having therein a pair of source/drain regions arranged parallel to each other;
a gate electrode which extends perpendicularly to and above the source/drain regions; and
a channel region formed in the semiconductor substrate between source/drain regions and just below the gate electrode;
wherein the memory cell is formed at a crossing of a pair of the source/drain regions and the gate electrodes, a first of the source/drain regions having a side which is spaced from the upper surface of the substrate in such a manner that electrical conduction does not occur between the pair of source/drain regions when the first source/drain region is operated as a source; and
wherein the gate electrode extends over the pair of the source/drain regions.

11. A two-bit memory cell according to claim 10, wherein at least a portion of the first source/drain region is spaced beneath the surface by a trench formed in the surface of the substrate, and wherein the trench is filled with an insulating film.

* * * * *